US012369284B2

(12) United States Patent
Maillot et al.

(10) Patent No.: US 12,369,284 B2
(45) Date of Patent: Jul. 22, 2025

(54) METHOD FOR CONTROLLING A COOLING SYSTEM OPERATIVELY CONNECTED TO A DATA PROCESSING DEVICE

(71) Applicant: OVH, Roubaix (FR)

(72) Inventors: Patrick-Gilles Maillot, Marsanne (FR); Michel Bieske, Wasquehal (FR); Christophe Maurice Thibaut, Noyelles les Seclin (FR)

(73) Assignee: OVH, Roubaix (FR)

( * ) Notice: Subject to any disclaimer, the term of this patent is extended or adjusted under 35 U.S.C. 154(b) by 293 days.

(21) Appl. No.: 17/943,907

(22) Filed: Sep. 13, 2022

(65) Prior Publication Data

US 2023/0098687 A1 Mar. 30, 2023

(30) Foreign Application Priority Data

Sep. 21, 2021 (EP) .................................... 21306303

(51) Int. Cl.
*H05K 7/20* (2006.01)
*G06N 3/049* (2023.01)

(52) U.S. Cl.
CPC ......... *H05K 7/20836* (2013.01); *G06N 3/049* (2013.01); *H05K 7/20209* (2013.01); *H05K 7/20281* (2013.01)

(58) Field of Classification Search
CPC .......... H05K 7/20836; H05K 7/20209; H05K 7/20281; G06N 3/049
See application file for complete search history.

(56) References Cited

U.S. PATENT DOCUMENTS

| | | | |
|---|---|---|---|
| 2018/0024578 A1* | 1/2018 | Ahuja | G06F 1/206 700/300 |
| 2019/0150326 A1* | 5/2019 | Gao | H05K 7/20745 361/679.47 |
| 2019/0265764 A1* | 8/2019 | Ping | G05B 13/024 |
| 2020/0034171 A1 | 1/2020 | Kommula et al. | |
| 2020/0355392 A1 | 11/2020 | So et al. | |
| 2021/0084797 A1* | 3/2021 | Shao | G06F 1/206 |
| 2021/0240147 A1* | 8/2021 | Papadopoulos | G06Q 10/0639 |
| 2021/0274688 A1* | 9/2021 | Rajput | F24F 11/88 |

OTHER PUBLICATIONS

European Communicaton with regard to EP Patent Application No. 21306303.5 issued Apr. 18, 2024.
Extended European Search Report with regard to the EP Patent Application No. 21306303.5 completed on Feb. 21, 2022.

* cited by examiner

*Primary Examiner* — Christopher W Carter
(74) *Attorney, Agent, or Firm* — BCF LLP (57) ABSTRACT

A method for controlling a cooling system operatively connected to a data processing device for cooling thereof. The method is executed by a controller operatively connected to the cooling system. The method comprises determining, using a machine learning model executed by the controller, an estimated forthcoming power consumption of the data processing device, the machine learning model being based at least in part on a history of power consumption of the data processing device, determining, using a cooling-control model executed by the controller, at least one control signal for controlling the cooling system, determining the at least one control signal being based at least in part on the estimated forthcoming power consumption from the machine learning model, and controlling, by the controller, the cooling system based on the at least one control signal for controlling the cooling system.

14 Claims, 6 Drawing Sheets

METHOD FOR CONTROLLING A COOLING SYSTEM OPERATIVELY CONNECTED TO A DATA PROCESSING DEVICE

CROSS-REFERENCE

The present application claims priority to European Patent Convention application Ser. No. 21/306,303.5, entitled "Method for Controlling a Cooling System Operatively Connected to a Data Processing Device," filed on 21 Sep. 2021, the entirety of which is incorporated by reference herein.

FIELD

The present technology relates to cooling techniques for electronic equipment. In particular, a method for controlling a cooling system operatively connected to a data processing device for cooling thereof is disclosed.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant thermal energy. In such racks, cooling requirements are thus often significant.

Cooling systems for racks commonly include fans that are mounted within equipment racks to provide forced ventilation cooling to rack-mounted equipment. This solution displaces some of the heat generated within the racks to the general environment of the data center. Air in the environment surrounding the racks is thus also heated and often requires an additional environmental cooling system.

Operation of cooling systems for racks are commonly adjusted based on current operation conditions of the electronic equipment, with the basic assumption that the current operating conditions will continue into the near future. This may not always be the case, which in circumstances where the operating conditions change over a short timeline could lead to unnecessary adjustments and resource overuse of the cooling systems.

There is thus a desire to provide a method for controlling a cooling system for a rack better managing power consumption of the cooling system.

SUMMARY

Embodiments of the present technology have been developed based on developers' appreciation of shortcomings associated with the prior art.

Broadly speaking, an aspect of the present technology introduces method for controlling a cooling system operatively connected to a data processing device for cooling thereof. In one embodiment, a controller determines an estimated forthcoming power consumption of the data processing device based on using a machine learning model. The machine learning model may take information about a current time and date, about an environment of the data processing device, about the data processing devices, and historical training data as inputs to determine the estimated forthcoming power consumption. The controller further determines at least one control signal for controlling the cooling system using a cooling-control model. The cooling-control model may take information about the cooling system, about a current power consumption of the data processing devices, about current weather conditions and, in some embodiments weather forecasts, and about safe operating temperatures of the data processing devices as inputs to determine the at least one control signal. The controller further controls the cooling system based on the at least one control signals. As such, control of the cooling system is at least in part based on the estimated forthcoming power consumption of the data processing device, which may permit power-efficient control of the cooling system and increase a power usage effectiveness (PUE) of a data center comprising the date processing device and the cooling system.

In one aspect, various implementations of the present technology provide a method for controlling a cooling system operatively connected to a data processing device for cooling thereof, the method being executed by a controller operatively connected to the cooling system, the method comprising determining, using a machine learning model executed by the controller, an estimated forthcoming power consumption of the data processing device, the machine learning model being based at least in part on a history of power consumption of the data processing device, determining, using a cooling-control model executed by the controller, at least one control signal for controlling the cooling system, determining the at least one control signal being based at least in part on the estimated forthcoming power consumption from the machine learning model, and controlling, by the controller, the cooling system based on the at least one control signal for controlling the cooling system.

In some embodiments of the method, determining the estimated forthcoming power consumption of the data processing device includes determining at least one estimated forthcoming power consumption for at least one server of the data processing device.

In some embodiments of the method, determining, using the cooling-control model, the at least one control signal for controlling the cooling system is further based at least in part on at least one of: a weather forecast retrieved by the controller, at least one temperature of the cooling system, the at least one temperature being determined by at least one temperature sensor in thermal contact with the cooling system and communicatively connected to the controller, and a pre-determined maximum power consumption of the data processing device.

In some embodiments of the method, the method further comprises determining a current power consumption of the data processing device and determining the at least one control signal for controlling the cooling system is further based at least in part on the current power consumption.

In some embodiments of the method, the machine learning model is built from a Long short-term memory (LSTM) architecture.

In some embodiments of the method, the method further comprises training the machine learning model using historical data relating to the data processing device, the historical data including power consumption data as it relates to at least one of: a day of the week, a time of day, a date and a seasonal weather condition.

In some embodiments of the method, determining the estimated forthcoming power consumption by the machine learning model includes inputting, by the controller, data relating to the data processing device to the machine learning model, the data input including at least one of: a current power consumption of the data processing device, a current day of the week, a current time of day, a current date, a geophysical location of the data processing device, a building-related performance parameter, at least one type of server of the data processing device and information relating to other proximate data processing devices.

In some embodiments of the method, the machine learning model is a predictive model configured to output at least one probability function associated with the forthcoming power consumption of the data processing device, and controlling the cooling system is based on the at least one probability function.

In some embodiments of the method, the method further comprises determining, by the controller using at least one temperature sensor, at least one temperature of a water-cooling loop in thermal contact with the data processing device; and in response to the at least one temperature being above a threshold temperature, activating the cooling system to cool the data processing device.

In some embodiments of the method, controlling the cooling system comprises controlling a rotation speed of at least one fan of an air-cooling subsystem of the cooling system and controlling a pump flow rate of at least one pump of a water-cooling subsystem of the cooling system.

In another aspect, various implementations of the present technology provide a system comprising at least one data processing device, a cooling system operatively connected to a data processing device for cooling thereof and a controller comprising a processor and a memory, the memory comprising instructions which, upon being executed by the processor, cause the controller to determine, using a machine learning model, an estimated forthcoming power consumption of the data processing device, the machine learning model being based at least in part on a history of power consumption of the data processing device, determine, using a cooling-control model and based at least in part on the estimated forthcoming power consumption from the machine learning model, at least one control signal for controlling the cooling system, and control the cooling system based on the at least one control signal for controlling the cooling system.

In some embodiments of the present technology, the data processing device is a server rack including a plurality of servers.

In some embodiments of the present technology, the machine learning model is based at least in part on an agglomerated history of power consumption by the plurality of servers.

In some embodiments of the present technology, the cooling system comprises a water-cooling system for circulating and cooling water in thermal contact with the data processing device, the water-cooling system including at least one pump for circulating water, an air-cooling system for circulating and cooling air through the data processing device, the air-cooling system including at least one fan for circulating air, and at least one air-to-liquid heat exchanger in thermal contact with the water-cooling system and the air-cooling system.

In some embodiments of the present technology, the at least one temperature sensor in thermal contact with at least one of the water-cooling system and the air-cooling system.

In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, the expression "component" is meant to include software (appropriate to a particular hardware context) that is both necessary and sufficient to achieve the specific function(s) being referenced.

In the context of the present specification, a "server" is a computer program that is running on appropriate hardware and is capable of receiving requests (e.g., from client devices) over a network, and carrying out those requests, or causing those requests to be carried out. The hardware may be one physical computer or one physical computer system, but neither is required to be the case with respect to the present technology. In the present context, the use of the expression a "server" is not intended to mean that every task (e.g., received instructions or requests) or any particular task will have been received, carried out, or caused to be carried out, by the same server (i.e., the same software and/or hardware); it is intended to mean that any number of software elements or hardware devices may be involved in receiving/sending, carrying out or causing to be carried out any task or request, or the consequences of any task or request; and all of this software and hardware may be one server or multiple servers, both of which are included within the expression "at least one server".

In the context of the present specification, unless expressly provided otherwise, an "indication" of an information element may be the information element itself or a pointer, reference, link, or other indirect mechanism enabling the recipient of the indication to locate a network, memory, database, or other computer-readable medium location from which the information element may be retrieved. For example, an indication of a document could include the document itself (i.e. its contents), or it could be a unique document descriptor identifying a file with respect to a particular file system, or some other means of directing the recipient of the indication to a network location, memory address, database table, or other location where the file may be accessed. As one skilled in the art would recognize, the degree of precision required in such an indication depends on the extent of any prior understanding about the interpretation to be given to information being exchanged as between the sender and the recipient of the indication. For example, if it is understood prior to a communication between a sender and a recipient that an indication of an information element will take the form of a database key for an entry in a particular table of a predetermined database containing the information element, then the sending of the database key is all that is required to effectively convey the information element to the recipient, even though the information element itself was not transmitted as between the sender and the recipient of the indication.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various systems that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

An aspect of the present technology introduces a method for controlling a cooling system operatively connected to a data processing device for cooling thereof, the method being executed by a controller operatively connected to the cooling system. Different types of cooling system are contemplated in the context of the present disclosure. As will be described in greater details hereafter, the data processing devices may be server mounted within server rack, or simply "racks", of a data center. A machine learning model may be executed by the controller to determine a forthcoming power consumption of the data processing devices. In an embodiment, the machine learning model is based at least in part on a history of power consumption of the data processing device. The machine learning model may have been trained by a machine learning algorithm (MLA). A cooling control model may be executed, based at least in part on the estimated forthcoming power consumption from the machine learning model, to determine at least one control signal for controlling the cooling system. The controller may thus control the cooling system based on the at least one control signal.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

With these fundamentals in place, we will now consider some non-limiting examples to illustrate various implementations of aspects of the present technology.

Figure 1:
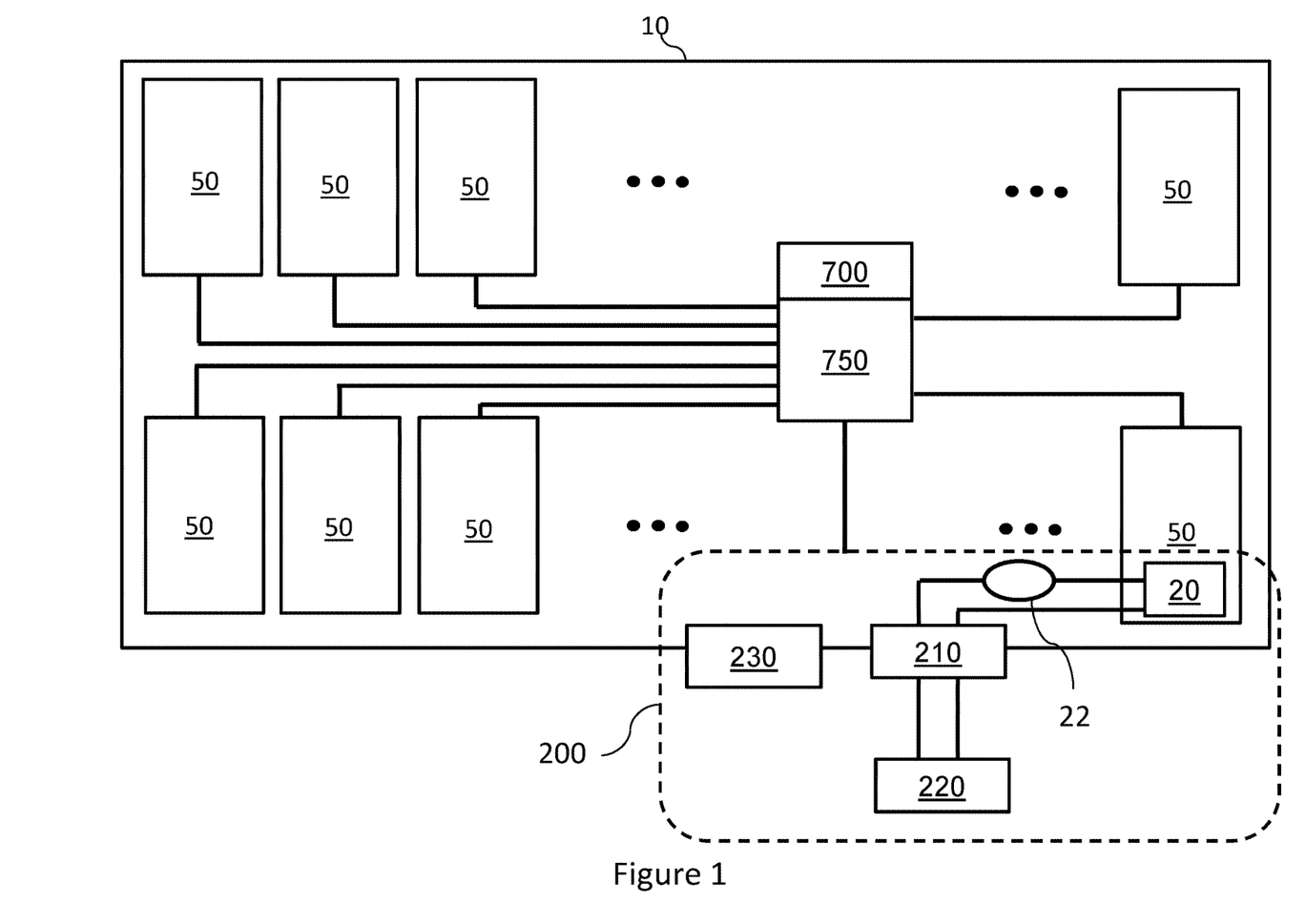
FIG. 1 is a block diagram of data processing devices mounted in a rack in accordance with an embodiment of the present technology.
Figure 2:
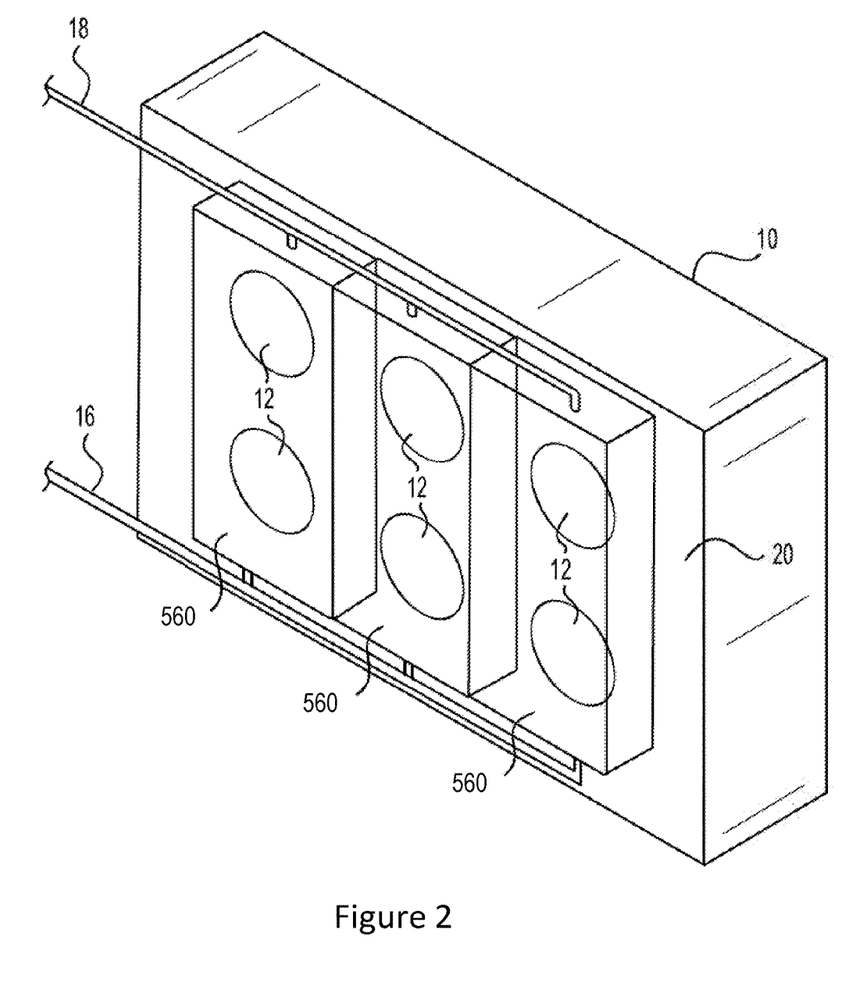
FIG. 2 is a schematic perspective view of the rack on which components of a cooling system are mounted in accordance with an embodiment of the present technology.

Referring at once to FIGS. 1 and 2, there is described a cooling system 200 for data processing devices 50. The cooling system 200 is configured for collecting thermal energy generated by the data processing devices 50 and, as such, providing cooling capacity to a rack 10 hosting the data processing devices 50 implementing non-limiting embodiments of the present technology. It is to be expressly understood that the cooling system 200 as depicted is merely an illustrative implementation of the present technology. Thus, the description thereof that follows is intended to be only a description of illustrative examples of the present technology. This description is not intended to define the scope or set forth the bounds of the present technology. In some cases, what are believed to be helpful examples of modifications to the cooling system 200 may also be set forth below. This is done merely as an aid to understanding, and, again, not to define the scope or set forth the bounds of the present technology. These modifications are not an exhaustive list, and, as a person skilled in the art would understand, other modifications are likely possible. Further, where this has not been done (i.e., where no examples of modifications have been set forth), it should not be interpreted that no modifications are possible and/or that what is described is the sole manner of implementing that element of the present technology. As a person skilled in the art would understand, this is likely not the case. In addition, it is to be understood that the cooling system 200 may provide in certain instances simple implementations of the present technology, and that where such is the case they have been presented in this manner as an aid to understanding. As persons skilled in the art would understand, various implementations of the present technology may be of a greater complexity.

As will be described in greater details hereinafter, the present disclosure describes a method for controlling the cooling system 200 such that power-efficient and autonomous cooling is provided to the data processing devices 50. As such, any system variation adapted to be operatively controlled according to methods described herein can be adapted to execute embodiments of the present technology, once teachings presented herein are appreciated. Embodiments of the present technology can be equally applied to other types of the cooling system 100.

Referring more particularly to FIG. 1, there is depicted a block diagram of the data processing devices 50 hosted in a rack 10. FIG. 1 is not to scale; relative sizes of the data processing devices 50 and perimeter of the rack 10 are for illustration purposes only. In this embodiment, the data processing devices 50 may be components of a computer system, such as a processor (for example a central processing unit (CPU), a graphical processing unit (GPU), and the like), network switches, random-access memory devices, hard disk drives, and other electric or electronic devices, that, in use generate thermal energy and are presented as heat-generating components 50 or servers communicably connected to a controller 700, the controller 700 being described in greater details hereafter.

For example, the data processing devices 50 may be implemented as conventional computer servers. In a non-limiting example of an embodiment of the present technology, a given one of the plurality of data processing devices 50 may be implemented as a Dell™ PowerEdge™ Server running the Microsoft™ Windows Server™ operating system. The given one of the plurality of data processing devices 50 may also be implemented in any other suitable hardware and/or software and/or firmware or a combination thereof.

For example, the data processing devices 50 may host (web) resources that can be accessed by other network components communicably connected to the data processing devices 50 via, for example, a networking device (not shown). Which type of resources the plurality of data processing devices 50 is hosting is not limiting. However, in some embodiments of the present technology, the resources may include digital documents, or simply "documents," that are representative of web pages. For example, the plurality of data processing devices 50 may host web pages, which means that the plurality of data processing devices 50 may store documents representative of web pages and which are accessible by other network components communicably connected thereto. A given document may be written in a mark-up language and may include inter alia (i) content of a respective web page and (ii) computer-readable instructions for displaying the respective web page (content thereof).

As another example, a given one of the data processing devices 50 may be used as a Virtual Machine (VM) by other network components. Therefore, in this example, one or more of the network components may benefit from the processing capacities of the given one of the data processing devices 50 used as a VM.

In this embodiment, each data processing device 50 may include a memory adapted to store data including information about a current configuration of the data processing device 50, said information including, for example, identifiers of other network components directly connected thereto, types of connection between the data processing device 50 and the other network components directly connected thereto, or any other information relevant for communicating with the controller 700.

In this embodiment, the data processing devices 50 may be inserted in the rack 10 and receives electric power from a power-distribution unit (not shown). The rack 10 may for example be a 19-inch, standard-size rack having dimensions as defined in the EIA/ECA-310-5 E "Cabinets, Racks, Panels, And Associated Equipment" standard published by The Electronic Components Sector Of The Electronic Industries Alliance, December 2005.

As an example, the data processing devices 50 may be introduced at a front of the rack 10. Also, while different embodiments of racks may be adapted for vertical insertion of components, the present disclosure describes a configuration in which the data processing devices 50 are insertable in a horizontal configuration within the rack 10.

In this embodiment, the cooling system 200 provides cooling capacity to the rack 10 such that thermal energy generated by the data processing devices 50 is collected and carried away by the cooling system 200. As will be described in greater detail hereafter, the cooling system may include components that are directly mounted onto the rack 10. The cooling system 200 is communicably connected to the controller 700 such that the controller may transmit control signals to the cooling system 200 for controlling the cooling system 200.

In an embodiment, the cooling system 200 includes a water-cooling system 20 adapted for collecting thermal energy via a heat transfer fluid. As an example, the water cooling system 20 may be a liquid cooling block (also called "water block", "cold plate", or "thermal transfer device", only one of which is represented for simplicity) thermally coupled to the data processing devices 50 to be cooled. A heat transfer fluid (e.g. water), is made to flow through an internal conduit of the liquid cooling block to absorb thermal from the corresponding data processing device 50. As the heat transfer fluid flows out of the liquid cooling block, so does the thermal energy collected thereby. As another example, the water-cooling system 20 may include immersion cooling systems whereby the data processing device 50 is immersed in a dielectric coolant or other immersion heat transfer fluid. In the illustrated embodiment, a pump is fluidly connected to the water-cooling system 20 to maintain a flow of the heat transfer fluid such that collection and carriage of thermal energy by the heat transfer fluid is properly maintained.

It is to be understood that the term "liquid cooling block" is intended to include such thermal transfer devices that use water, or any fluids other than water and/or multiphase flow (e.g., two-phase flow). For example, in some instance, the fluid may be an oil, an alcohol, or a dielectric heat transfer fluid (e.g., 3M Novec®).

Circulation of the heat transfer fluid in the internal conduit permits absorption of thermal energy from the data processing device 50. As an example, the liquid cooling block may define a fluid inlet and a fluid outlet for respectively feeding and discharging the heat transfer fluid from the internal fluid conduit. As the heat transfer fluid flows out of the liquid cooling block, so does the thermal energy absorbed thereby.

The water-cooling system 20 may be fluidly connected to a water-cooling loop thermally and/or fluidly connected to a cooling apparatus adapted for receiving the heated heat transfer fluid from the liquid cooling block. In this embodiment, the cooling apparatus is an air-to-liquid heat exchanger 220 expelling thermal energy in an ambient air in a vicinity of the rack 10 and/or outside the data centre. As such, the heated heat transfer fluid discharged from the liquid cooling block may be cooled in the cooling apparatus before returning to the liquid cooling block. The heat transfer fluid may, for example be direct through the liquid-to-liquid heat exchanger 210 such that a second heat transfer fluid may collect the thermal energy. The first heat transfer fluid may thus be cooled and further redirected to the water-cooling system 20, thereby defining the water-cooling loop. In one embodiment, the controller 700 activates the cooling system 200 (e.g. by turning the pump 22 on) in response to determining, based on a temperature sensor, at least one temperature of the first and/or second heat transfer fluid above a temperature threshold.

In this embodiment, the second heat transfer fluid is direct to the air-to-liquid heat exchanger 220 for expelling thermal energy. The cooling apparatus through which the first and second heat transfer fluids are cooled may be of various constructions, being for example an air-to-liquid heat exchanger or a liquid-to-liquid heat exchanger.

In the context of the rack 10 being a rack of a data center, the cooling system 200 may further include other components such as fans disposed within the data center, air-conditioning systems, or any other suitable systems that may provide direct or indirect cooling to the data processing devices 50. As will be described hereafter, the cooling system 200 as illustrated includes an air-cooling system 230.

Even though the controller 700 is depicted as being communicably connected to a group of data processing devices 50 and the cooling system 200 of the rack 10, the controller 700 may be communicably connected to a plurality of groups of data processing devices 50 and a plurality of corresponding cooling systems 200 of other racks 10 in alternative embodiments, the controller 700 being adapted to control the plurality of cooling systems 200 independently based at least in part on a power consumption of the data processing devices of their corresponding racks 10.

In this embodiment, the controller 700 is communicably connected to a power distribution unit (PDU) 750 providing electric power to the data processing devices 50. More specifically, each data processing device 50 is connected to one electric power outlet of the PDU 750 via a power link. Communication between the controller 700 and a given one of the data processing devices 50 and between the PDU 750 and the given one of the data processing devices 50 is depicted as a single communication line on FIG. 1 for simplicity.

The PDU 750 may be linked to a networking device and a source of power (not shown) via power lines. Although one controller 700, one PDU 750 and eight data processing devices 50 are represented on FIG. 1, the rack 10 may include different number of controllers, PDUs and data processing devices. This aspect is not limitative.

Each electric power outlet of the PDU 750 includes an output circuit. The output circuit is adapted to sense one or more power parameters related to their corresponding electric power outlet. For each electric power outlet, electric system operating data is generated therefrom to assess the electric health of the electric system connected to said electric power outlet. In one embodiment of the present technology, the electric system operating data generation relating to one specific electric power outlet includes calculation of an average value of electric power consumption over a certain period of time, a minimal value of electric power consumption over the certain period of time and a maximal value of electric power consumption over the certain period of time. The PDU 750 and the corresponding output circuit may be implemented as described in the European Patent Application No. 20315274.9 filled on May 25, 2020, the entirety of which is incorporated herein by reference.

In this embodiment, the controller 700 stores electric system operating data of each data processing device 50 under the form of an evolution record such that evolution of the electric system operating data such as power consumption may be established and analyzed.

As an example, FIG. 2 is a highly schematic perspective view of the rack 10 on which components of the air-cooling system 230 are mounted. The rack 10 hosts a number of data processing devices 50, for example servers (not shown) in a data center, that generate a significant amount of thermal energy. A number of fans 12 (six fans are shown without limiting the present disclosure) expel heated air from the rack 10 in a direction of three (3) air-to-liquid heat exchangers 560 mounted behind a backplane 20 of the rack 10. On FIG. 1, the air-to-liquid heat exchangers 560 are shown in transparent form in order to render the fans 12 visible. In this embodiment, the air-to-liquid heat exchangers 560 receive cold heat transfer fluid, for example water, from a cold liquid line 16 and further transmit the heated heat transfer fluid to a hot liquid line 18. The airflow having passed through the air-to-liquid heat exchangers 560 may be somewhat cooled down to allow maintaining an ambient temperature of the data center to a reasonable level.

Figure 3:
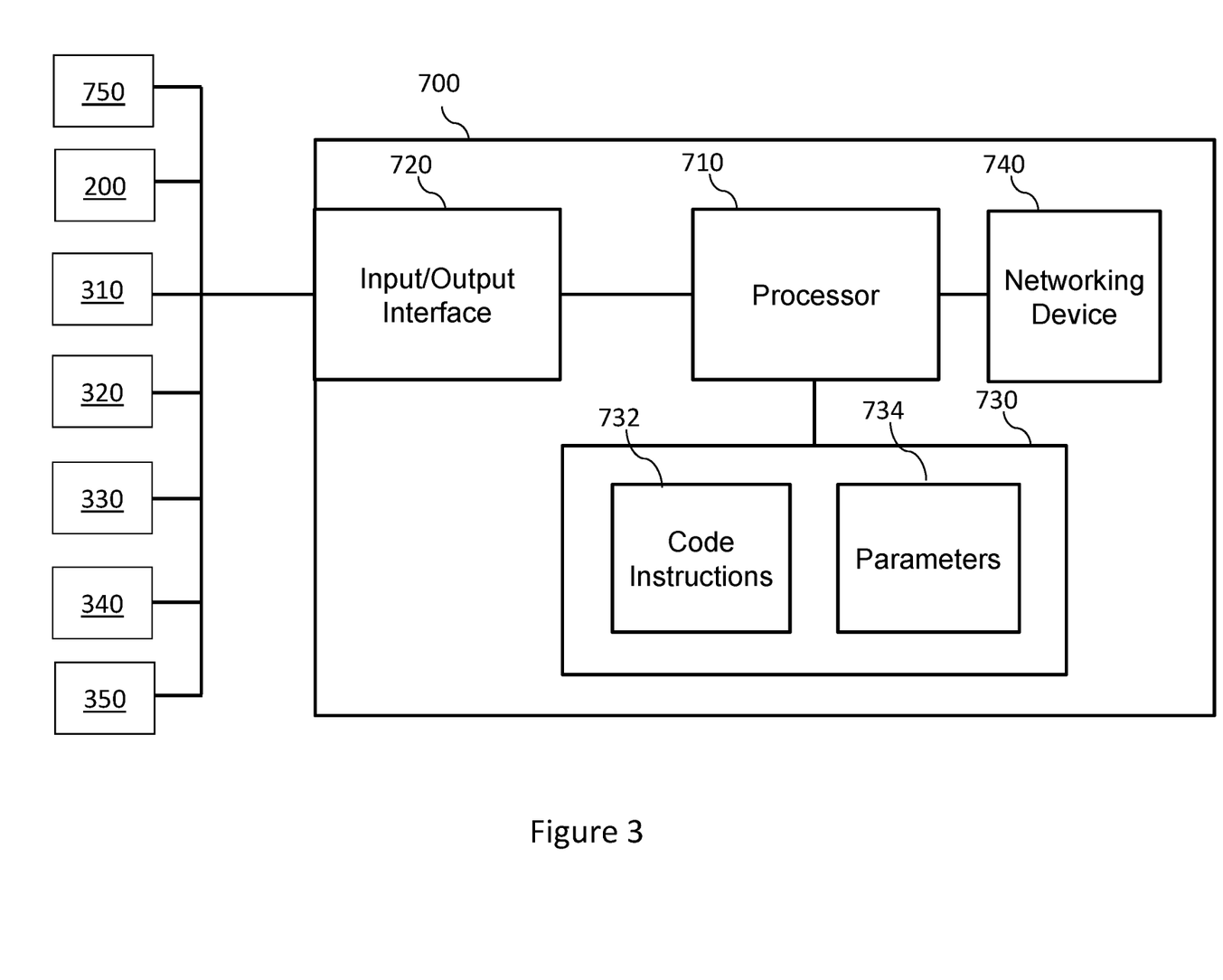
FIG. 3 is a block diagram of a controller for controlling the cooling system of FIG. 2 in accordance with an embodiment of the present technology.

As an example, FIG. 3 is a schematic block diagram of the controller 700 of the cooling system 200 according to an embodiment of the present technology. The controller 700 includes a processor or a plurality of cooperating processors (represented as a processor 710 for simplicity), a memory device or a plurality of memory devices (represented as a memory device 730 for simplicity), and a input/output interface 720 allowing the controller 700 to communicate with the cooling system 200 and a plurality of sensors. The plurality of sensors includes:

- one or more fan speed sensors 310, adapted for providing signals indicative of a rotational speed of the one or more fans 12 and/or other fans of the datacenter;
- a cooling pump flow rate sensor 320 adapted for providing signals indicative of a flow rate of the pump 22 and/or other pumps fluidly connected to the water-cooling system 200;
- one or more water-cooling temperature sensors 330 adapted for providing signals indicative of temperature of the first and second heat transfer fluids;
- one or more power consumption sensors 340 adapted for providing signals indicative of a power consumption of the data processing devices (e.g. the PDU 750); and
- one or more air temperature sensors 350 adapted for providing signals indicative of temperature of air in a vicinity of the rack 10 and/or within the rack 10.

In this embodiment, the processor 710 is operatively connected to the memory device 730, the input/output interface 720, and a networking device 740. The networking device 740 may implement specific physical layer and data link layer standard such as Ethernet, Fibre Channel, Wi-Fi or Token Ring. The specific physical layer and the data link layer may provide a base for a full network protocol stack, allowing communication among small groups of computers on the same local area network (LAN) and large-scale network communications through routable protocols, such as Internet Protocol (IP). The memory device 730 includes a storage for storing parameters 934, including for example and without limitation feedback control signals provided by the sensors 310, 320, 330, 340 and 350. The memory device 730 may include a non-transitory computer-readable medium for storing code instructions 732 that are executable by the processor 910 to allow the controller 700 to perform the various tasks allocated to the controller 700.

The controller 700 is operatively connected, via the input/output interface 720, to the sensors 310, 320, 330, 340 and 350, the PDU 750 and the cooling system 200. The controller 930 executes the code instructions 932 stored in the memory device 730 to implement the various above-described functions that may be present in a particular embodiment. In this embodiment, the processor 710 is adapted to determine, using a machine learning model 410 (see FIG. 4), an estimated forthcoming power consumption of the data processing devices 50, the machine learning model being based at least in part on a history of power consumption of the data processing device, and to determine, using a cooling-control model 420 (see FIG. 4), at least one control signal for controlling the cooling system 200. Inputs of the machine learning model 410 and the cooling-control model 420 are described in greater details hereafter. FIG. 3 as illustrated represents a non-limiting embodiment in which the controller 700 orchestrates operations of the cooling system 200. This particular embodiment is not meant to limit the present disclosure and is provided for illustration purposes.

Figure 4:
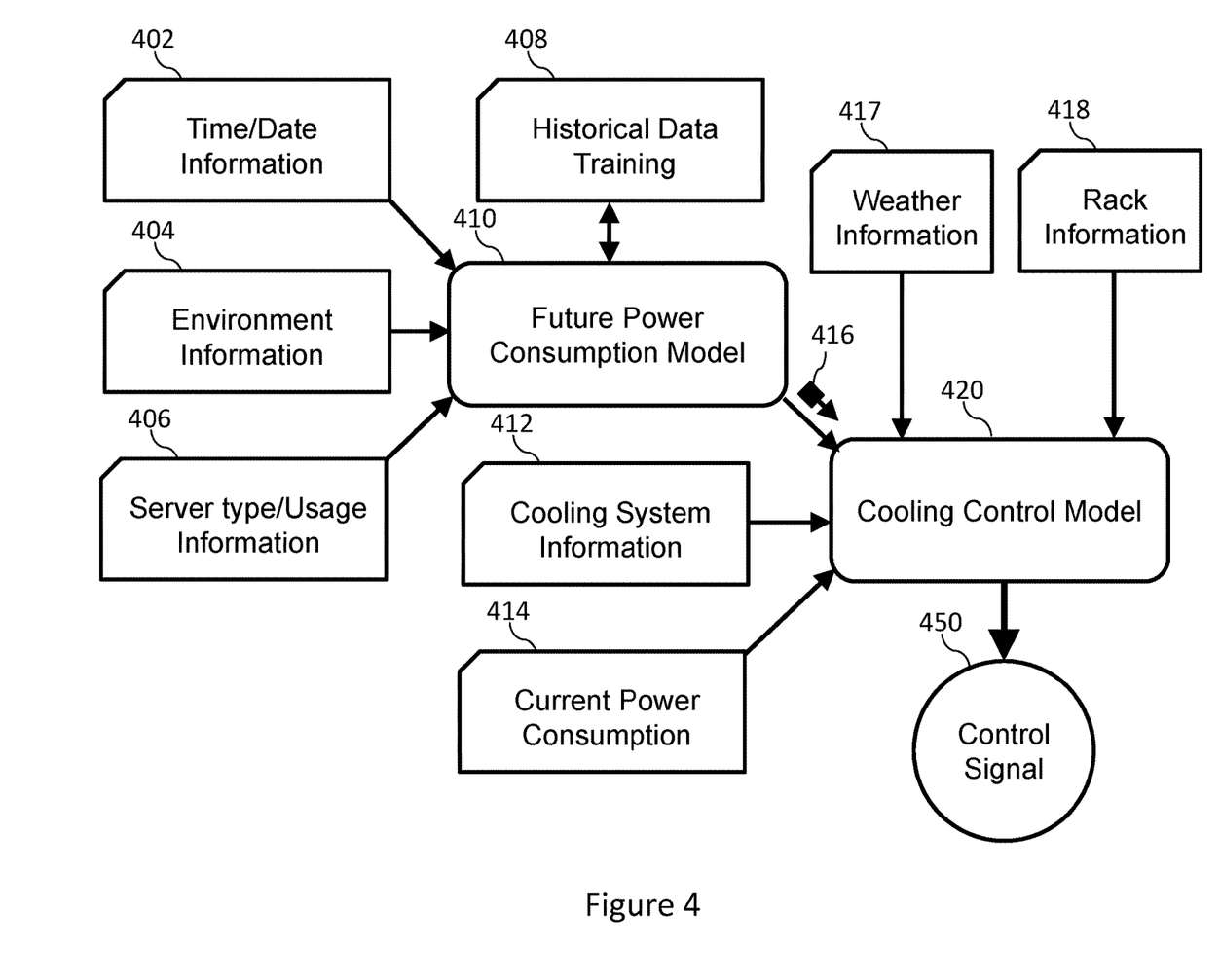
FIG. 4 is a block diagram of an execution of a machine learning model and a cooling-control model by the controller of FIG. 3 for determining a control signal for the cooling system of FIG. 2 in accordance with an embodiment of the present technology.

FIG. 4 is a block diagram illustrating an execution of the machine learning model, depicted as a future power consumption model 410, and the cooling-control model 420. In this embodiment, the future power consumption model 410 determines an estimated forthcoming power consumption of the data processing devices 50 based on:
- a first data 402 including information about a current time and date of the execution of the future power consumption model 410 (e.g. a current day of the week, a current time of day, a current date), the first data 402 may also include information about a time and date corresponding to the estimated forthcoming power consumption of the data processing devices 50, the information may be, for example, a number of days and/or hours from a current time and date;
- a second data 404 including information about an environment of the rack 10 such as geophysical location of the data centre, characteristics of a building hosting the data center, building insulation, building-related performance parameters and the like;
- a third data 406 including information about the data processing devices 50 and information relating to other proximate data processing devices 50 (e.g. in the same or another rack 10 of the data center) such as a type of servers, processors, disks, standard electric power consumption and thermal energy characteristics; and
- a fourth data 408 including information about historical training data, the historical training data including power consumption data as it relates to at least one of a day of the week, a time of day, a date, and a seasonal weather condition, the fourth data 408 including, in one embodiment, agglomerated history of power consumption by the data processing devices 50 (e.g. a plurality of servers) provided by the PDU 750.

In this embodiment, the first and fourth data 402, 408 are dynamic, such that they may be updated (e.g. at a predetermined rate). As an example, the first data 402 may be updated by the controller 700 based on newly received data from the networking device 740. Other data may be additionally used as inputs by the future power consumption model 410. The first, second, third and fourth data 402, 404, 406 and 408 may be populated in the memory device 730 and/or in respective databases communicably connected to the controller 700.

More specifically, the fourth data 408 includes training datasets, each training dataset including a set of first, second and third data 402, 404, 406, defining a set of experimental parameters associated with a corresponding power consumption of the data processing devices 50 actually measured by, for example, the PDU 750 for the defined set of experimental parameters. As previously described, the PDU 750 may be used by the controller 700 to generate an evolution record of the power consumption of the data processing devices 50. For example, based on the evolution record, the future power consumption model 410 may determine that power consumption of the data processing devices 50 tends to decrease on Friday at 21:00 each week. This estimation may further be adjusted based on the third data 406 for example. A training of the future power consumption model 410 is described in greater details hereafter.

In this embodiment, the future power consumption model 410 is a long short-term memory (LSTM) architecture of an artificial recurrent neural network (RNN) and generates data 416 including information about an estimation of the forthcoming power consumption of the data processing devices 50. The data 416 may include an estimation of the forthcoming power consumption of each of the data processing devices 50 individually. The memory device 730 and/or a database including historical training data may be further populated with the data 416, the data 416 being identified as an "estimation" to be compared with an actual measurement of the power consumption of the data processing devices 50. It is contemplated that the future power consumption model 410 may be any deep learning architecture suitable for determining the estimated forthcoming power consumption of the data processing devices 50 in alternative embodiments.

As such, the future power consumption model 410 is a predictive model and may output, in parallel to the data 416, at least one probability function associated with the forthcoming power consumption of the data processing devices 50.

In this embodiment, the controller 700 further executes the cooling-control model 420 based on the data 416, i.e. the estimation of the forthcoming power consumption, and:
- a fifth data 412 including information about the cooling system 200, the fifth data 412 including, for example, signals provided by the one or more fan speed sensors 310, the cooling pump flow rate sensor 320, the one or more water-cooling temperature sensors 330, the one or more power consumption sensors 340 and/or the one or more air temperature sensors 350, the fifth data 412 may also include information about types and characteristics of the sensors 310, 320, 330, 340 and 350;
- a sixth data 414 including information about a current power consumption of the data processing devices 50 provided, for example, by the PDU 750;
- a seventh data 417 including information about current weather conditions and, in some embodiments weather forecasts, in a vicinity of the data centre, the fifth data 412 may be, for example, retrieved by the networking device 740 from websites and/or resources databases; and an eighth data 418 including information about safe operating temperatures of the data processing devices 50 and/or the rack 10 and a pre-determined maximum power consumption of the data processing devices 50.

In this embodiment, the cooling-control model 420 generates a control signal 450 executable by the controller 700 to control the cooling system 200, thereby providing control of the cooling system 200 based at least in part on the estimated forthcoming power consumption of the data processing devices 50. A weight coefficient of the data 416 in determining the control signal 450 may be weighted by the at least one probability function associated with the data 416. For example, the cooling-control model 420 may consider a data 416 less important for a probability function indicative that the estimation is trustworthy at 25% compared to data 416 associated with a probability function indicative that the estimation is trustworthy at 80%.

Once the control signal 450 is generated, it may be executed by the controller 700 to control the cooling system 200. More specifically, the controller 700 may control a rotation speed of the fans 12 and/or a pump flow rate of the pump 22 based on the control signal 450.

As an example, in response to the estimated forthcoming power consumption of the data processing devices 50 being relatively low (e.g. that the forthcoming power consumption is excepted to be low in one hour according to the future power consumption model 410), and even though a current power consumption of the data processing devices 50 may be relatively high, the control signal 450 may be determined such that an execution thereof may not increase a rotation speed of the fans 12 and/or a pump flow rate of the pump 22 (e.g. given that that the forthcoming power consumption is excepted to be low in one hour such that no additional cooling capacity is needed to ensure proper operation of the data processing devices 50).

Figure 5:
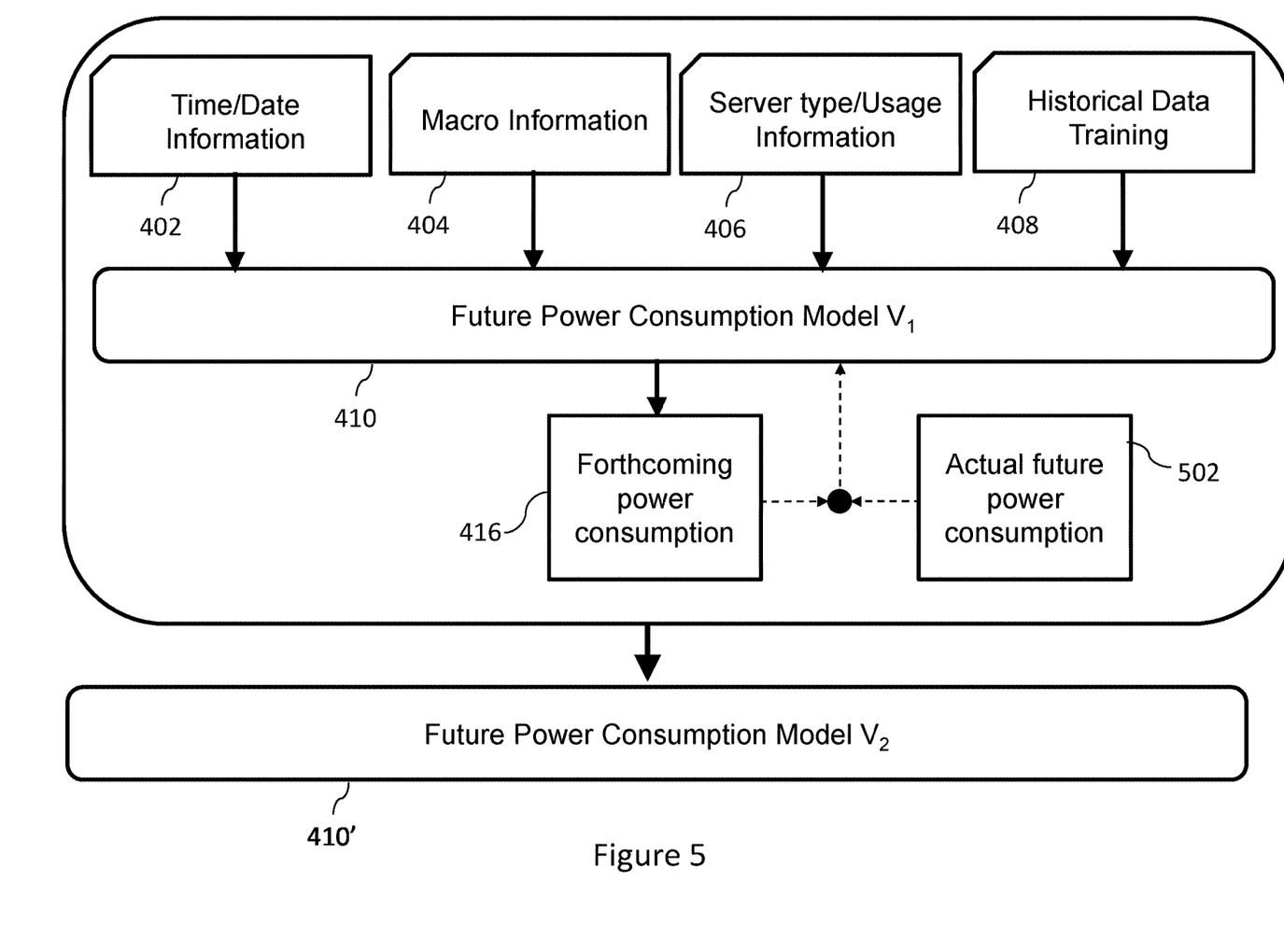
FIG. 5 is a block diagram of a training of the machine learning model in accordance with an embodiment of the present technology.

As illustrated on FIG. 5, a first version of the future power consumption model 410, noted as 'v1', may have been deployed on the controller 700. Therefore, prior to being trained, the future power consumption model 410 may have a first set of model parameters. It should be noted that training of future power consumption model 410 may involve using training datasets for one or more machine learning algorithms (MLAs). For example, the future power consumption model 410 may use training datasets including first, second, third, fourth and fifth data 402, 404, 406 and 408, and a training label representative of the actual power consumption of the data processing devices 50 at a time and date of the estimation of the forthcoming power consumption provided by the future power consumption model 410 referred to as data 416.

During a given training iteration, the training label can be further compared to the data 416 outputted of the future consumption model 410 such that errors of estimation may be backpropagated to update the model parameters. In at least some embodiments of the present technology, the comparison of the output of the future consumption model 410 during training against the training label may be performed by employing a loss function for determining a "loss" that is used for adjusting the future consumption model 410 during the respective training iteration.

To train the future power consumption model 410, the data 402, 404, 406 and 408 may also be used as a training input in at least some embodiments. Once the training input is provided to the future consumption model 410, the future consumption model 410 generates the data 416 as an output. The controller 700 further fetches data 502, representative of an actual power consumption of the data processing devices 50, as a training label against the output data 416. It can be said that the data 502 is representative of a "ground-truth" of the power consumption of data processing devices 50. It should be noted that a time and date of the power consumption of data processing devices 50 of the data 502 corresponds to a given time and date of the estimation of the data 416. For example, the future power consumption model 410 may be executed at 15:00 to provide an estimation of a given data processing device 50 at 18:00 the same day. As such, the data 502 may be fetched at 18:00, i.e. three hours after the execution of the future power consumption model 410. Comparison between data 416 and 502 may thus be performed at 18:00.

The controller 700 may apply a loss function for determining how different the output data 416 is from the training label data 502. The controller 700 may further generate a "loss" based on the loss function for adjusting the model parameters of the future power consumption model 410.

Based on an indication of the loss function, the model parameters of the future power consumption model 410 may be updated. More specifically, a second future power consumption model 410' may be generated based on an update of the model parameters of the future power consumption model 410. It may be said that the second future power consumption model 410' is an iterated version, noted "v2", of the future power consumption model 410, or that the future power consumption model 410 has been trained by one training iteration. In FIG. 5, the future power consumption model 410 and the second future power consumption model 410' are separately depicted. However, it should be understood that the updated model parameters may be directly implemented in the future power consumption model 410, thereby updating the initial version "v1" into the second future power consumption model 410' "v2".

As such, in this embodiment, the future power consumption model 410 may be trained by one training iteration when a current time and date correspond to a time and date of the estimation of the forthcoming power consumption has been reached.

Figure 6:
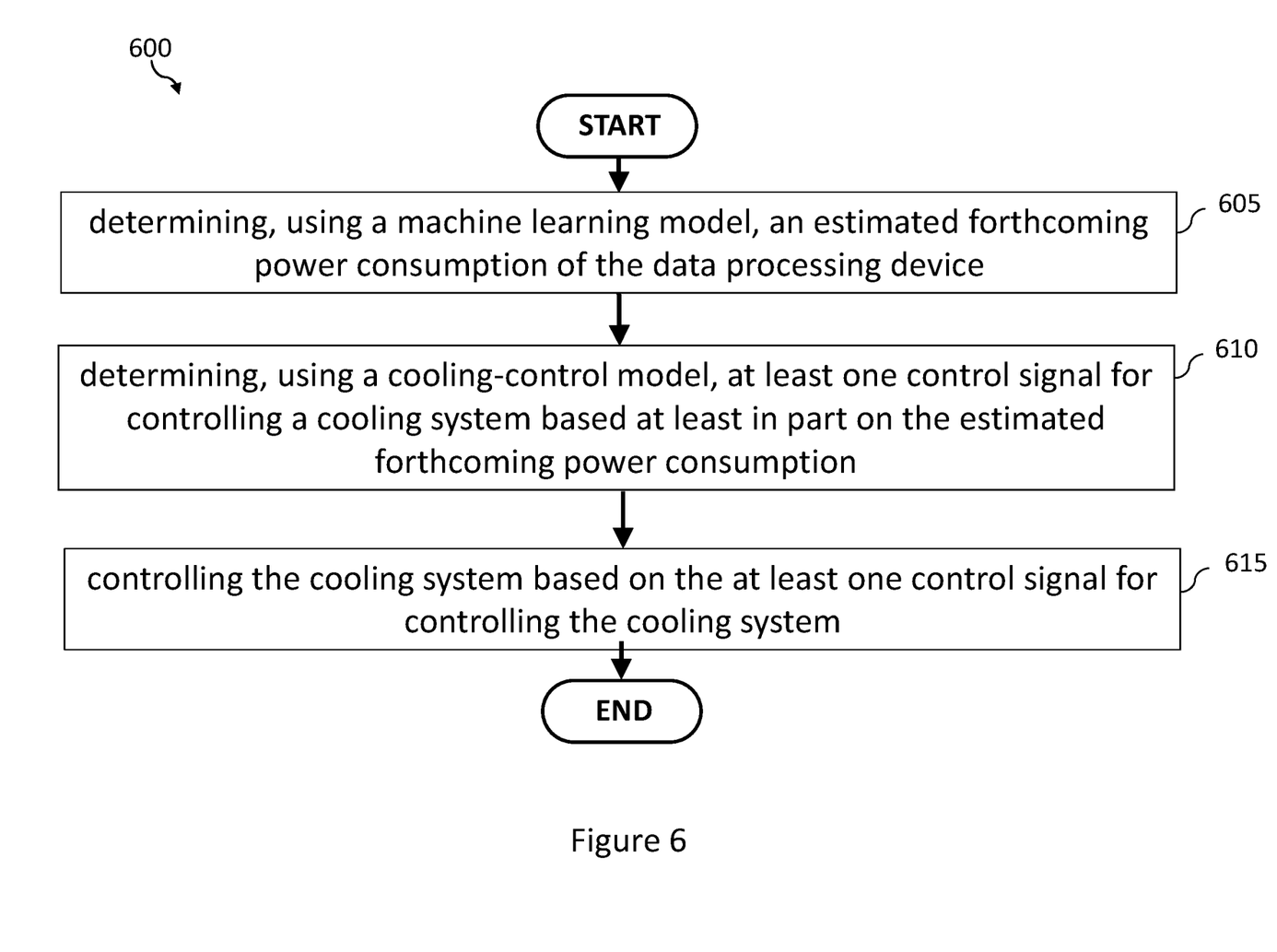
FIG. 6 illustrates a flow diagram showing operations of a method for controlling a cooling system operatively connected to a data processing device for cooling thereof in accordance with an embodiment of the present technology.

FIG. 6 is a flow diagram showing operations of a method 600 for controlling the cooling system 200 operatively connected to the data processing devices 50 for cooling thereof in accordance with an embodiment of the present technology. In one or more aspects, the method 600 is performed by the controller 700. In some implementations, one or more operations of the method 600 could be implemented, in whole or in part, by another computer-implemented device. It is also contemplated that the method 600 or one or more operation thereof may be embodied in computer-executable instructions that are stored in a computer-readable medium, such as a non-transitory mass storage device, loaded into memory and executed by a processor, such as the processor 710. Some operations or portions of operations in the flow diagram may be possibly being executed concurrently, omitted or changed in order.

The method 600 begins with determining, at operation 605 by the controller 700, an estimated forthcoming power consumption of the data processing devices 50. To do so, the controller 700 executes the future power consumption model 410 that outputs, based on the data 402, 404, 406 and 408, the estimated forthcoming power consumption of the data processing devices 50 as data 416. As such, the data 416 is based at least in part, in this embodiment, on a current day of the week, a current time of day, a current date, a geophysical location of the data processing device, a building-related performance parameter, at least one type of server of the data processing device, and information relating to other proximate data processing devices.

In this embodiment, the future power consumption model 410 is a machine learning model built from a Long short-term memory (LSTM) architecture that takes data 402, 404, 406 and 408 as inputs. Therefore, the estimated forthcoming power consumption of the data processing devices 50 is determined base at least in part on the historical training data 408 including power consumption data as it relates to at least one of a day of the week, a time of day, a date and a seasonal weather condition. As such, the future power consumption model 410 may be, in one embodiment, a predictive model adapted to output at least one probability function associated with the estimation of the forthcoming power consumption of the data processing devices 50. Said at least one probability function may be included in the data 416.

The method 600 continues with determining, at operation 610 by the controller 700 and based at least in part on the estimated forthcoming power consumption (i.e. data 416) from the future power consumption model 410, the control signal 450 for controlling the cooling system 200. More specifically, the controller 700 executes the cooling-control model 420 to generate the control signal 450. In this embodiment, the cooling-control model 200 may use the data 416, a weather forecast retrieved by the controller 700 (information included in the data 417), at least one temperature of the cooling system 200 (information included in data 412 and provided by the one or more sensors 330 for example), a current power consumption of the data processing devices 50 (information included in the data 414) and a pre-determined maximum power consumption of the data processing device (information included in the data 418) as inputs.

The determination of the control signal 450 by the cooling-control model 420 may thus be based at least in part on the at least one probability function associated with the estimation of the forthcoming power consumption of the data processing devices 50 and included in the data 416.

The method 600 ends with controlling, at operation 615 by the controller 700, the cooling system 200 based on the control signal 450 for controlling the cooling system 200. In this embodiment, the controller 700 controls a rotation speed of the fans 12 and/or a pump flow rate of the pump 22 based on the control signal 450.

In one embodiment, the controller 700 activates the cooling system 200 to cool the data processing devices 50 in response to at least one temperature of the water-cooling loop (e.g., a temperature of the first and/or second heat transfer fluid sensed by the one or more sensors 330) being above a temperature threshold. For example, the controller 700 may increase the rotation speed of the fans 12 and/or the pump flow rate of the pump 22.

In one embodiment, given that the control signal 450 has been at least determined based on the at least one probability function, controlling the cooling system may thus be based on the at least one probability function associated with the estimation of the forthcoming power consumption of the data processing devices 50.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method for controlling a cooling system operatively connected to a data processing device for cooling thereof, the method being executed by a controller operatively connected to the cooling system, the method comprising:
determining, using a machine learning model executed by the controller, an estimated forthcoming power consumption of the data processing device, the machine learning model being based at least in part on a history of power consumption of the data processing device;
determining, using a cooling-control model executed by the controller, at least one control signal for controlling the cooling system, determining the at least one control signal being based at least in part on the estimated forthcoming power consumption from the machine learning model; and
controlling, by the controller, the cooling system based on the at least one control signal for controlling the cooling system, controlling the cooling system comprising:
controlling a rotation speed of at least one fan of an air-cooling subsystem of the cooling system, and
controlling a pump flow rate of at least one pump of a water-cooling subsystem of the cooling system; wherein
the machine learning model is a predictive model trained to output at least one probability function associated with the forthcoming power consumption of the data processing device; and wherein
controlling the cooling system is based on the at least one probability function.

2. The method of claim 1, wherein:
determining the estimated forthcoming power consumption of the data processing device includes determining at least one estimated forthcoming power consumption for at least one server of the data processing device.

3. The method of claim 1, wherein determining, using the cooling-control model, the at least one control signal for controlling the cooling system is further based at least in part on at least one of:
a weather forecast retrieved by the controller;
at least one temperature of the cooling system, the at least one temperature being determined by at least one temperature sensor in thermal contact with the cooling system and communicatively connected to the controller; and
a pre-determined maximum power consumption of the data processing device.

4. The method of claim 1, further comprising determining a current power consumption of the data processing device; and
wherein determining the at least one control signal for controlling the cooling system is further based at least in part on the current power consumption.

5. The method of claim 1, wherein the machine learning model is built from a Long short-term memory (LSTM) architecture of an artificial recurrent neural network.

6. The method of claim 1, further comprising training the machine learning model using historical data relating to the data processing device, the historical data including power consumption data as it relates to at least one of:
- a day of the week;
- a time of day;
- a date; and
- a seasonal weather condition.

7. The method of claim 1, wherein determining the estimated forthcoming power consumption by the machine learning model includes inputting, by the controller, data relating to the data processing device to the machine learning model, the data input including at least one of:
- a current power consumption of the data processing device;
- a current day of the week;
- a current time of day;
- a current date;
- a geophysical location of the data processing device;
- a building-related performance parameter;
- at least one type of server of the data processing device; and
- information relating to other proximate data processing devices.

8. The method of claim 1, further comprising:
- determining, by the controller using at least one temperature sensor, at least one temperature of a water-cooling loop in thermal contact with the data processing device; and
- in response to the at least one temperature being above a threshold temperature, activating the cooling system to cool the data processing device.

9. A system comprising:
- at least one data processing device;
- a cooling system operatively connected to a data processing device for cooling thereof; and
- a controller comprising a processor and a memory, the memory comprising instructions which, upon being executed by the processor, cause the controller to:
  - determine, using a machine learning model, an estimated forthcoming power consumption of the data processing device, the machine learning model being based at least in part on a history of power consumption of the data processing device;
  - determine, using a cooling-control model and based at least in part on the estimated forthcoming power consumption from the machine learning model, at least one control signal for controlling the cooling system; and
  - control the cooling system based on the at least one control signal for controlling the cooling system, controlling the cooling system comprising:
    - controlling a rotation speed of at least one fan of an air-cooling subsystem of the cooling system, and
    - controlling a pump flow rate of at least one pump of a water-cooling subsystem of the cooling system;
  - wherein
    - the machine learning model is a predictive model trained to output at least one probability function associated with the forthcoming power consumption of the data processing device; and wherein
    - controlling the cooling system is based on the at least one probability function.

10. The system of claim 9, wherein the data processing device is a server rack including a plurality of servers.

11. The system of claim 10, wherein the machine learning model is based at least in part on an agglomerated history of power consumption by the plurality of servers.

12. The system of claim 9, wherein the cooling system comprises:
- the water-cooling subsystem for circulating and cooling water in thermal contact with the data processing device, the water-cooling subsystem including the at least one pump for circulating water;
- the air-cooling subsystem for circulating and cooling air through the data processing device, the air-cooling subsystem including the at least one fan for circulating air; and
- at least one air-to-liquid heat exchanger in thermal contact with the water-cooling subsystem and the air-cooling subsystem.

13. The system of claim 12, further comprising at least one temperature sensor in thermal contact with at least one of:
- the water-cooling subsystem; and
- the air-cooling subsystem.

14. The system of claim 9, wherein the machine learning model is built from a Long short-term memory (LSTM) architecture of an artificial recurrent neural network.

* * * * *